US012696770B2

(12) United States Patent
Tsuruoka

(10) Patent No.: US 12,696,770 B2
(45) Date of Patent: Jul. 28, 2026

(54) SEMICONDUCTOR DEVICE AND METHOD FOR MANUFACTURING THE SAME

(71) Applicant: FUJI ELECTRIC CO., LTD., Kawasaki (JP)

(72) Inventor: Ryotaro Tsuruoka, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 717 days.

(21) Appl. No.: 17/975,218

(22) Filed: Oct. 27, 2022

(65) Prior Publication Data

US 2023/0154882 A1 May 18, 2023

(30) Foreign Application Priority Data

Nov. 16, 2021 (JP) ................................. 2021-186511

(51) Int. Cl.
*H10W 70/02* (2026.01)
*H10W 40/22* (2026.01)
(Continued)

(52) U.S. Cl.
CPC ....... *H10W 70/027* (2026.01); *H10W 70/658* (2026.01); *H10W 70/66* (2026.01);
(Continued)

(58) Field of Classification Search
CPC ........... H01L 23/3735; H01L 23/49866; H01L 24/32; H01L 24/83; H01L 21/4878; H01L 23/49844; H01L 23/057; H01L 24/29;

H01L 24/48; H01L 24/73; H01L 23/49811; H01L 23/24; H01L 23/3677; H01L 23/3736; H01L 23/12; H01L 21/4871;
(Continued)

(56) References Cited

U.S. PATENT DOCUMENTS 5,373,731 A * 12/1994 Tanaka .............. H01L 21/67138
73/104
9,679,832 B1 * 6/2017 Heng ................ H01L 23/49513
(Continued)

FOREIGN PATENT DOCUMENTS

JP 7-106350 A 4/1995
JP 2009-094157 A 4/2009
(Continued)

OTHER PUBLICATIONS

Japanese Office Action issued in counterpart Japanese Application No. 2021-186511 dated Oct. 7, 2025.
(Continued)

*Primary Examiner* — Mouloucoulaye Inoussa

(57) ABSTRACT
A semiconductor device includes: a semiconductor base body; a semiconductor chip; a sintering material layer bonded to a lower surface of the semiconductor chip and having a thickness decreasing toward an outer periphery of the semiconductor chip; and a conductive plate having a main surface facing the lower surface of the semiconductor chip and a recessed portion which the sintering material layer contacts in the main surface, the recessed portion having a depth decreasing toward the outer periphery of the semiconductor chip.

18 Claims, 18 Drawing Sheets

(51) Int. Cl.

| | |
|---|---|
| *H10W 40/25* | (2026.01) |
| *H10W 70/65* | (2026.01) |
| *H10W 70/66* | (2026.01) |
| *H10W 72/00* | (2026.01) |
| *H10W 72/30* | (2026.01) |
| *H10W 72/50* | (2026.01) |
| *H10W 90/00* | (2026.01) |

(52) U.S. Cl.
CPC ........ *H10W 40/228* (2026.01); *H10W 40/258* (2026.01); *H10W 72/07331* (2026.01); *H10W 72/07332* (2026.01); *H10W 72/07352* (2026.01); *H10W 72/07353* (2026.01); *H10W 72/07354* (2026.01); *H10W 72/07552* (2026.01); *H10W 72/321* (2026.01); *H10W 72/331* (2026.01); *H10W 72/334* (2026.01); *H10W 72/342* (2026.01); *H10W 72/352* (2026.01); *H10W 72/521* (2026.01); *H10W 72/884* (2026.01); *H10W 90/734* (2026.01); *H10W 90/736* (2026.01); *H10W 90/754* (2026.01)

(58) Field of Classification Search
CPC ........... H01L 21/4821; H01L 23/49562; H01L 25/18; H01L 25/07; H01L 23/562; H01L 23/13; H01L 23/40; H01L 24/97; H01L 23/49531; H01L 23/3121; H01L 23/49586; H01L 23/49513; H01L 23/49558; H01L 23/49575; H01L 21/561; H01L 23/4334; H01L 23/49582; H01L 2224/3207; H01L 2224/32225; H01L 2224/48225; H01L 2224/32112; H01L 2224/8384; H01L 2224/48011; H01L 2224/48091; H01L 2924/35121; H01L 2224/3201; H01L 2224/32111; H01L 2224/73265; H01L 2924/1011; H01L 2224/83203; H01L 2224/32245; H01L 2224/32059; H01L 2224/29139; H01L 2224/29247; H01L 2924/10272; H01L 2924/351; H01L 2224/83385; H01L 2924/01046; H01L 2924/00014; H01L 2224/29338; H01L 2924/01014; H01L 2924/013; H01L 2924/01079; H01L 2224/29317; H01L 2924/01032; H01L 2224/29339; H01L 2924/13055; H01L 2224/73215; H01L 2224/83447; H01L 2224/16245; H01L 2924/181; H01L 2924/00012; H05K 7/1007; H10D 1/692
See application file for complete search history.

(56) References Cited

U.S. PATENT DOCUMENTS

| | | | |
|---|---|---|---|
| 11,271,352 B2 | 3/2022 | Takewaki et al. | |
| 2008/0145607 A1* | 6/2008 | Kajiwara | H01L 21/563 |
| | | | 428/323 |
| 2010/0252312 A1* | 10/2010 | Wolde-Giorgis | H01L 24/75 |
| | | | 228/256 |
| 2013/0032845 A1* | 2/2013 | Chuang | H10H 20/018 |
| | | | 257/E33.057 |
| 2017/0084510 A1 | 3/2017 | Hoshino et al. | |
| 2017/0250128 A1* | 8/2017 | Fontana | H01L 23/49541 |
| 2018/0096919 A1* | 4/2018 | Roth | H01L 24/97 |
| 2018/0190611 A1* | 7/2018 | Tatsumi | H01L 24/32 |
| 2018/0366383 A1* | 12/2018 | Yokoyama | H01L 24/32 |
| 2019/0348350 A1* | 11/2019 | Fontana | H01L 23/49589 |
| 2020/0052449 A1 | 2/2020 | Takewaki et al. | |
| 2020/0235271 A1* | 7/2020 | Altieri-Weimar | |
| | | | H10H 20/8312 |
| 2020/0251423 A1* | 8/2020 | Yabuta | H01L 23/12 |
| 2020/0402944 A1 | 12/2020 | Iwashige et al. | |
| 2021/0280551 A1 | 9/2021 | Fuji | |
| 2021/0407894 A1* | 12/2021 | Fontana | H01L 24/73 |
| 2022/0189848 A1* | 6/2022 | Gu | H01L 24/83 |
| 2022/0254738 A1* | 8/2022 | Yabuta | H01L 25/07 |
| 2022/0415747 A1* | 12/2022 | Yokoyama | H05K 3/321 |
| 2023/0223308 A1* | 7/2023 | Kim | H01L 23/485 |
| | | | 257/737 |

FOREIGN PATENT DOCUMENTS

| | | | |
|---|---|---|---|
| JP | 2014-135411 A | 7/2014 |
| JP | 2015207747 A | 11/2015 |
| JP | 201792168 A | 5/2017 |
| JP | 2018156988 A | 10/2018 |
| JP | 2020-025027 A | 2/2020 |
| JP | 20212563 A | 1/2021 |
| JP | 2021-027116 A | 2/2021 |
| WO | 2020050077 A1 | 3/2020 |

OTHER PUBLICATIONS

Japanese Office Action issued in counterpart Japanese Application No. 2021-186511 dated Apr. 14, 2026.

* cited by examiner

SEMICONDUCTOR DEVICE AND METHOD FOR MANUFACTURING THE SAME

CROSS-REFERENCE TO RELATED APPLICATION

This application claims benefit of priority under 35 USC 119 based on Japanese Patent Application No. 2021-186511 filed on Nov. 16, 2021, the entire contents of which are incorporated by reference herein.

BACKGROUND OF THE INVENTION

1. Field of the Invention

The present invention relates to a semiconductor device (semiconductor module) and a method for manufacturing the same.

2. Description of the Related Art

A conventional semiconductor module contains a semiconductor chip, an insulating circuit board, and a heat dissipation base which are bonded to one another by solder and is finally attached to a cooling fin via a thermal compound for use. For the bonding between the semiconductor chip and the insulating circuit board, soldering has been mainly carried out. In recent years, however, researches on a sintering bonding technology using nanoparticles or microparticles of metals, such as silver (Ag), have proceeded for the purpose of high heat resistance, high heat dissipation, high reliability, and the like.

Sintering materials used in the sintering bonding technology include a paste-like sintering material (sintering paste) and a sheet-like sintering material (sintering sheet). The sintering paste is applied onto the insulating circuit board using a metal mask or the like, and dried for use. The sintering sheet is transferred to the lower surface of the semiconductor chip, and then arranged on and bonded to the insulating circuit board. Regardless of whether the sintering paste or the sintering sheet is used, the sintering material is sintered by pressurization and heating to bond the insulating circuit board and the semiconductor chip.

JP 2021-002563 A discloses that the destruction of a semiconductor chip is suppressed by forming a recessed portion corresponding to a projection portion on the surface side of the semiconductor chip in the sintering sheet. JP 2015-207747 A discloses that a recessed portion is provided in a wide bandgap material base, a silver powder is charged into the recessed portion, and a wide bandgap chip is placed on the silver powder of the recessed portion, followed by sintering. WO 2020/050077 A1 discloses that the chip mounting surface of a conductor of a substrate includes a roughened region subjected to roughening treatment, and a sintering metal layer is formed on the roughened region.

JP 2018-156988 A discloses that a plurality of spherical projection portions is formed on the back surface to be bonded to a sintering bonding material of a semiconductor chip and wiring on the upper surface to be bonded to a sintering bonding material of a ceramic substrate.

JP 2017-92168 A discloses that a semiconductor module includes an insulating substrate, a wiring layer formed on the insulating substrate, a semiconductor chip arranged on the wiring layer in an overlapping manner and having one terminal electrically connected to the wiring layer, and a metal sintering bonding material fixing and electrically connecting between the wiring layer and the semiconductor chip, in which the wiring layer has a groove portion inside the outer periphery of the overlapping semiconductor chip in a plan view.

SUMMARY OF THE INVENTION

When the sintering sheet is transferred to the semiconductor chip, the sintering sheet is placed on an elastic body, such as rubber, via a protective film, and the semiconductor chip is placed on the sintering sheet. Then, heating and pressurizing are performed, the sintering sheet is cut at the end of the semiconductor chip by utilizing the sinking of the elastic body, and a sintering material layer, which is a part of the sintering sheet, is transferred to the lower surface of the semiconductor chip.

However, due to the curvature of the protective film or the rubber under the sintering sheet, the end of the sintering material layer transferred to the semiconductor chip is curved. When the semiconductor chip is bonded onto the insulating circuit board via the sintering material layer in this state, the curved end of the sintering material layer is not bonded to the insulating circuit board, resulting in an opened shape. This poses problems that cracks are likely to be generated from the outer periphery of the bonded surface with the insulating circuit board of the sintering material layer and the sintering material layer is likely to be separated from the insulating circuit board, lowering the bonding strength.

In view of the above-described problems, it is an object of the present invention to provide a semiconductor device capable of preventing the lowering of the bonding strength of the sheet-like sintering material layer resulting from the curved shape of the sintering material layer when the sintering material layer is transferred to the semiconductor chip.

An aspect of the present invention inheres in a semiconductor device including: a semiconductor chip; a sintering material layer bonded to a lower surface of the semiconductor chip and having a thickness decreasing toward an outer periphery of the semiconductor chip; and a conductive plate having a main surface facing the lower surface of the semiconductor chip and a recessed portion which the sintering material layer contacts in the main surface, the recessed portion having a depth decreasing toward the outer periphery of the semiconductor chip.

Another aspect of the present invention inheres in a method for a semiconductor device including: forming a recessed portion in a main surface of a conductive plate; transferring a sintering material layer having a curved shape to a lower surface of a semiconductor chip; and causing the sintering material layer transferred to the semiconductor chip to face the recessed portion of the conductive plate, sintering the sintering material layer by performing pressurization and heating from an upper surface side of the semiconductor chip, and bonding the conductive plate and the semiconductor chip to each other.

DETAILED DESCRIPTION

Figure 1:
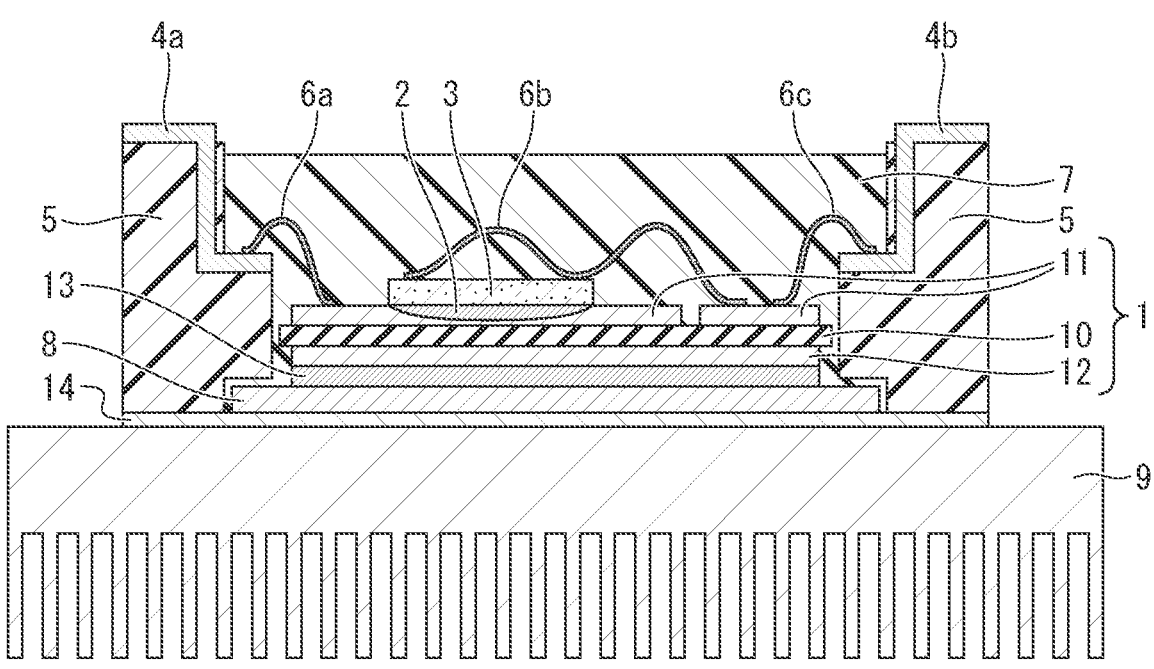
FIG. 1 is a cross-sectional view illustrating a semiconductor device according to a first embodiment.

With reference to the Drawings, first to eighth embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to eighth embodiments described below merely illustrate schematically devices and methods for specifying and giving shapes to the technical idea of the present invention, and the span of the technical idea is not limited to materials, shapes, structures, and relative positions of elements described herein.

In the Specification, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

First Embodiment

<Configuration of Semiconductor Device>

A semiconductor device (semiconductor module) according to a first embodiment includes an insulating circuit board 1, a power semiconductor chip (semiconductor chip) 3 arranged facing the main surface (upper surface) of the insulating circuit board 1, and a bonding layer (sintering material layer) 2 containing a sintering material arranged between the insulating circuit board 1 and the semiconductor chip 3 as illustrated in FIG. 1.

The insulating circuit board 1 may be a direct copper bonded (DCB) substrate, an active metal brazing (AMB) substrate, or the like, for example. The insulating circuit board 1 includes an insulating plate 10, a conductive plate (circuit plate) 11 arranged on the upper surface of the insulating plate 10, and a conductive plate (heat sink) 12 arranged on the lower surface of the insulating plate 10. The insulating plate 10 contains a ceramic substrate formed of aluminum oxide ($Al_2O_3$), aluminum nitride (AlN), silicon nitride ($Si_3N_4$), or the like or a resin insulating substrate using a polymer material or the like, for example. The conductive plates 11, 12 contain a conductor foil, such as copper (Cu) foil or aluminum (Al) foil, for example.

The sintering material layer 2 is formed by sintering a sheet-like sintering material (sintering sheet) containing metal particles of gold (Au), silver (Ag), copper (Cu), or the like and an organic component (binder), for example. The metal particles have a fine particle size of about several nm to several μm. For example, a silver (Ag)-based sintering material has features that the silver (Ag)-based sintering material can be bonded at a low temperature and has the same melting point as that of Ag after bonding, and a bonding layer having high heat resistance and high reliability is obtained without raising the bonding temperature.

The semiconductor chip 3 is arranged facing the main surface (upper surface) of the conductive plate 11. As the semiconductor chip 3, an insulated gate bipolar transistor (IGBT), a field effect transistor (FET), a static induction (SI) thyristor, a gate turn-off (GTO) thyristor, a freewheeling diode (FWD), and the like can be adopted, for example. The semiconductor chip 3 may contain a silicon (Si) substrate or a compound semiconductor containing a wide bandgap semiconductor, such as silicon carbide (SiC), gallium nitride (GaN), or gallium oxide ($Ga_2O_3$), for example. A lower surface electrode containing gold (Au) or the like of the semiconductor chip 3 is bonded to the conductive plate 11 via the sintering material layer 2. FIG. 1 illustrates one semiconductor chip 3 as an example, but the number of semiconductor chips can be set as appropriate according to the current capacity or the like of the semiconductor module, and two or more semiconductor chip may be provided.

A case 5 containing an insulating material, such as resin, is arranged to surround the outer periphery of the insulating circuit board 1 and the semiconductor chip 3. The inside of the case 5 is filled with a sealing member 7 sealing the sintering material layer 2 and the semiconductor chip 3. As the sealing member 7, an insulating material, such as a silicone gel or a thermosetting resin, is usable, for example. To the case 5, external terminals 4a, 4b are fixed. The semiconductor chip 3, the conductive plate 11, and the external terminals 4a, 4b are electrically connected to one another via bonding wires 6a, 6b, 6c.

The lower surface of the insulating circuit board 1 is bonded to a heat dissipation base 8 formed of metals, such as copper (Cu), via a bonding layer 13. The lower surface of the heat dissipation base 8 is bonded to a heat dissipation fin 9 formed of metals, such as copper (Cu), via a bonding layer 14. As the bonding layers 13, 14, sintering materials, solder materials, and thermal interface materials (TIM) are usable, for example. The bonding layers 13, 14 may contain a material the same as or different from that of the sintering material layer 2.

Figure 2:
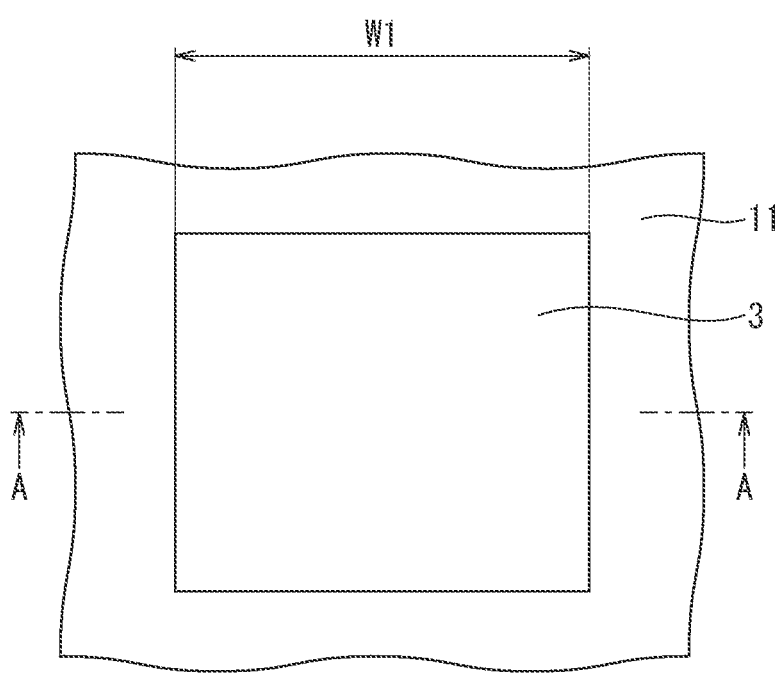
FIG. 2 is a plan view of the semiconductor device according to the first embodiment.

FIG. 2 is a plan view of the conductive plate 11 and the semiconductor chip 3 of the insulating circuit board 1 of the semiconductor device according to the first embodiment illustrated in FIG. 1. As illustrated in FIG. 2, the semiconductor chip 3 has a rectangular planar pattern. The size of the semiconductor chip 3 is about 1 mm×1 mm or more and 10 mm×10 mm or less, for example, but is not limited thereto. The upper surface in contact with the semiconductor chip 3 of the sintering material layer 2 has a rectangular planar pattern, and the upper surface in contact with the semiconductor chip 3 of the sintering material layer 2 is in alignment with the outer periphery of the semiconductor chip 3. The outer periphery of the upper surface of the sintering material layer 2 may be arranged outside the outer periphery of the semiconductor chip 3.

Figure 3:
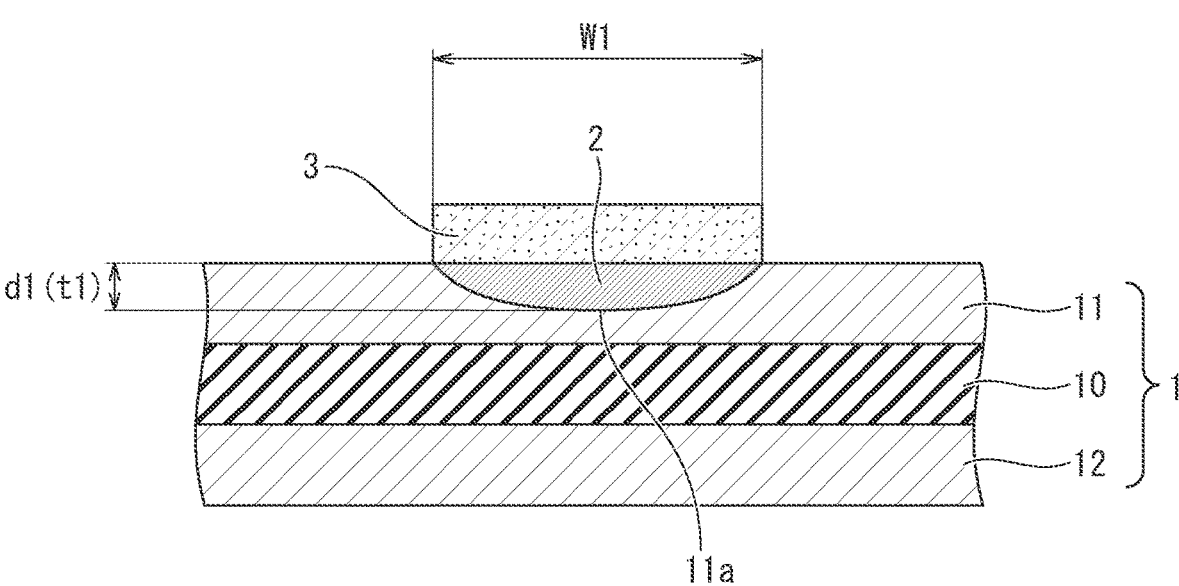
FIG. 3 is a cross-sectional view viewed from the A-A direction in FIG. 2.

FIG. 3 is a cross-sectional view viewed from the A-A direction in FIG. 2. As illustrated in FIG. 3, a recessed portion 11*a* is provided in the main surface (upper surface) of the conductive plate 11 of the insulating circuit board 1. A depth d1 of the recessed portion 11*a* is relatively large on the center side of the recessed portion 11*a* and is relatively small on the outer peripheral side of the recessed portion 11*a*. The depth d1 of the recessed portion 11*a* is the largest in a center portion of the recessed portion 11*a* and decreases from the center portion toward the outer peripheral side of the recessed portion 11*a*. In the semiconductor device according to the first embodiment, the recessed portion 11*a* entirely has a curved surface and is entirely formed into a curved shape.

The sintering material layer 2 is embedded in the recessed portion 11*a* and is provided in contact with the recessed portion 11*a*. The surface in contact with the recessed portion 11*a* of the sintering material layer 2 has the same shape as that of the recessed portion 11*a*, and at least the end of the sintering material layer 2 is formed into a curved shape. A thickness t1 of the sintering material layer 2 is relatively large on the center side of the semiconductor chip 3 and is relatively small on the outer peripheral side of the semiconductor chip 3. The thickness t1 of the sintering material layer 2 is the largest in a center portion of the semiconductor chip 3 and decreases from the center portion of the semiconductor chip 3 toward the outer peripheral side of the semiconductor chip 3. FIG. 3 illustrates a case where the thickness t1 of the sintering material layer 2 is equal to the depth d1 of the recessed portion 11*a*.

According to the semiconductor device of the first embodiment, the sintering material layer 2 is provided to be embedded in the recessed portion 11*a* of the conductive plate 11 and contact the recessed portion 11*a*, and therefore the generation of cracks or the occurrence of peeling in the outer periphery of the sintering material layer 2 can be prevented and the lowering of the bonding strength can be prevented. Further, the bonded area between the sintering material layer 2 and the conductive plate 11 is larger than that in a case where the sintering material layer 2 of the curved shape is bonded to the conductive plate 11 having a flat shape, and therefore heat generated from the semiconductor chip 3 can be efficiently dissipated to the conductive plate 11 side via the sintering material layer 2. This makes it possible to realize a semiconductor device with high heat resistance, high heat dissipation, and high reliability.

<Method for Manufacturing Semiconductor Device>

Figure 4:
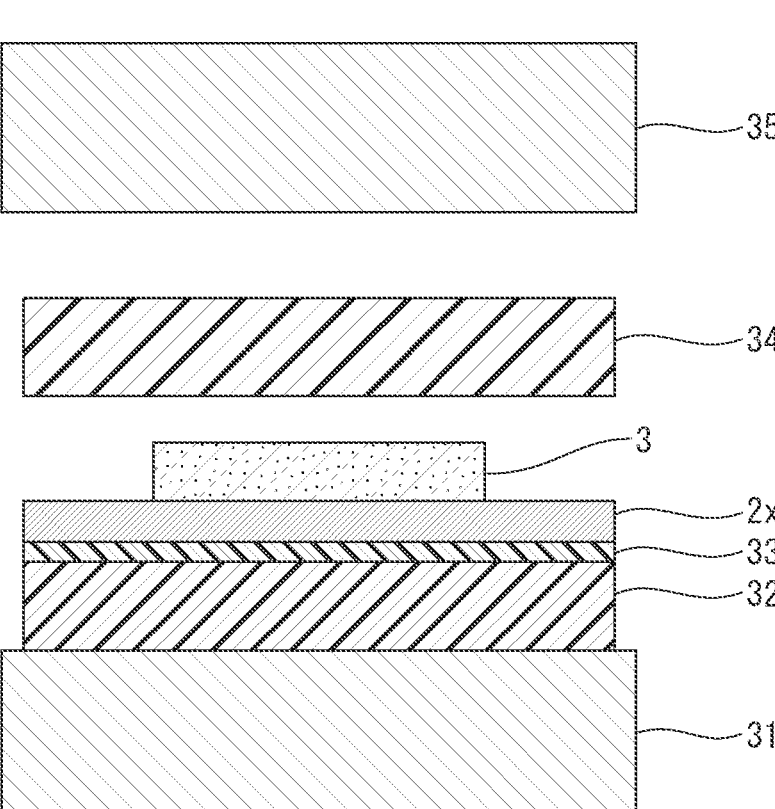
FIG. 4 is a schematic view of a method for manufacturing the semiconductor device according to the first embodiment.

Next, a method for manufacturing (method for assembling) the semiconductor device according to the first embodiment is described. First, as illustrated in FIG. 4, an elastic body 32, such as rubber, is arranged on the upper surface of a support portion 31 of a press machine. Then, a sintering sheet 2*x*, which is a sheet-like sintering material, is placed on the upper surface of the elastic body 32 via a protective film 33 using a carrying machine or the like. Then, the semiconductor chip 3 is placed on the sintering sheet 2*x* using a carrying machine or the like.

Figure 5:
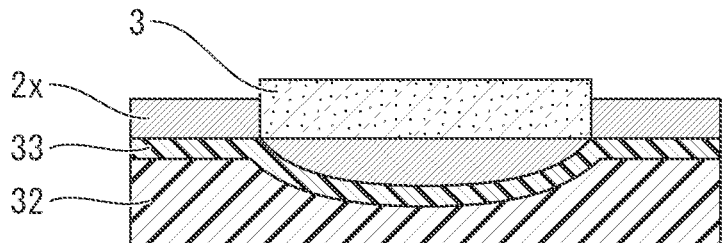
FIG. 5 is a schematic view following FIG. 4 illustrating the method for manufacturing the semiconductor device according to the first embodiment.

Next, a pressurizing portion 35 of the press machine performs pressurization from the upper surface side of the semiconductor chip 3 via a cushioning material 34, such as dust-free paper, to press the lower surface of the semiconductor chip 3 against the sintering sheet 2*x*. When the pressurization is performed from the upper surface side of the semiconductor chip 3, heating may be performed such that the sintering sheet 2*x* can be easily transferred. At this time, the elastic body 32 is curved and the protective film 33 is curved without being cut, so that the sintering sheet 2*x* is cut in the outer periphery of the semiconductor chip 3 as illustrated in FIG. 5.

Figure 6:
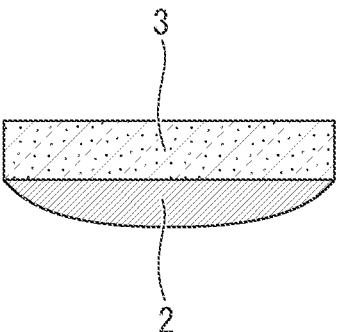
FIG. 6 is a schematic view following FIG. 5 illustrating the method for manufacturing the semiconductor device according to the first embodiment.

Next, the pressurizing portion 35 of the press machine is raised and the semiconductor chip 3 is removed from the press machine. As illustrated in FIG. 6, the sintering material layer 2 containing a part of the sintering sheet 2*x* is transferred to the lower surface of the semiconductor chip 3. The sintering material layer 2 has a curved shape corresponding to the curved shape of the elastic body 32 and the protective film 33 when the semiconductor chip 3 is pressurized from the upper surface side and at least an outer peripheral portion (end) of the sintering material layer 2 is curved. The thickness of the sintering material layer 2 is relatively large on the center side of the semiconductor chip 3 and is relatively small on the outer peripheral side of the semiconductor chip 3. The thickness of the sintering material layer 2 decreases from the center side of the semiconductor chip 3 toward the outer peripheral side of the semiconductor chip 3.

Figure 7:
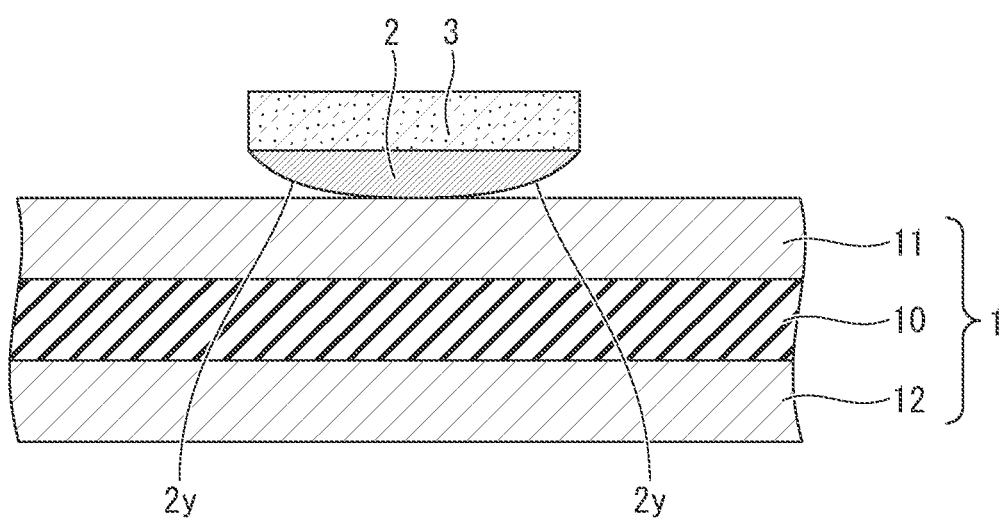
FIG. 7 is a cross-sectional view of a semiconductor device according to a comparative example.

Herein, a case is considered in which the semiconductor chip 3 to which the sintering material layer 2 has been transferred illustrated in FIG. 6 is bonded onto the flat conductive plate 11 of the insulating circuit board 1. In this case, heating and pressurization are performed from the upper surface side of the semiconductor chip 3, so that the flat conductive plate 11 of the insulating circuit board 1 and the semiconductor chip 3 are bonded to each other via the sintering material layer 2 as illustrated in FIG. 7. At this time, an outer peripheral portion 2*y* of the sintering material layer 2 is curved, and therefore the outer peripheral portion 2*y* of the sintering material layer 2 is not bonded to the conductive plate 11 and is formed to have an opened shape. As a result, cracks are likely to be generated from a bonded portion between the outer peripheral portion 2*y* of the sintering material layer 2 and the conductive plate 11, and the sintering material layer 2 is likely to be peeled off, and therefore the bonding strength is lowered.

Figure 8:
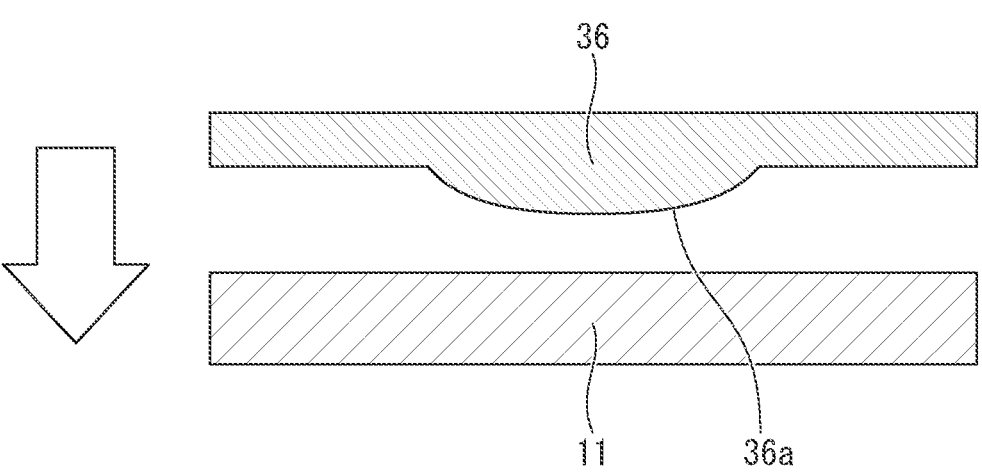
FIG. 8 is a schematic view following FIG. 6 illustrating the method for manufacturing the semiconductor device according to the first embodiment.
Figure 9:
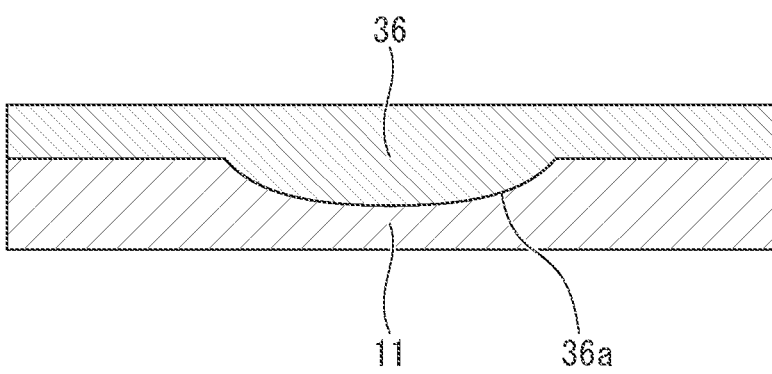
FIG. 9 is a schematic view following FIG. 8 illustrating the method for manufacturing the semiconductor device according to the first embodiment.
Figure 10:
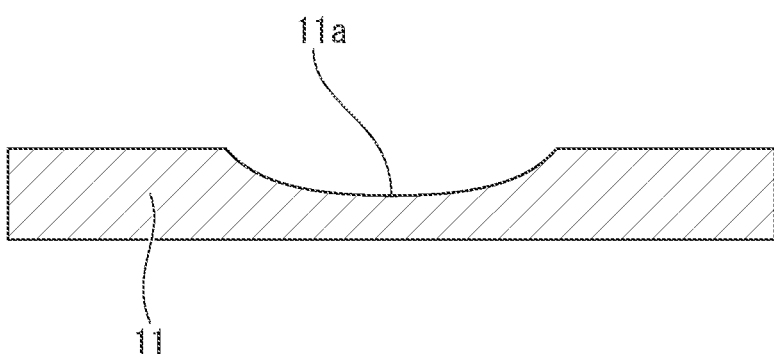
FIG. 10 is a schematic view following FIG. 9 illustrating the method for manufacturing the semiconductor device according to the first embodiment.

Therefore, in the method for manufacturing the semiconductor device according to the first embodiment, the recessed portion 11*a* is formed in advance in the conductive plate 11. For example, as illustrated in FIG. 8, a jig 36 is prepared which has a processing portion 36*a* having a shape corresponding to the curved shape of the sintering material layer 2 illustrated in FIG. 6. Then, the processing portion 36*a* of the jig 36 is made to face the flat conductive plate 11, and then pressurization is performed from above the processing portion 36*a* of the jig 36, so that a position where the semiconductor chip 3 is to be mounted of the flat conductive plate 11 is pressurized as illustrated in FIG. 9. Thereafter, the jig 36 is removed, so that the recessed portion 11a is formed in the conductive plate 11a s illustrated in FIG. 10.

The recessed portion 11a has a curved shape corresponding to the curved shape of the sintering material layer 2 and substantially the same as the curved shape of the sintering material layer 2. The shape of the recessed portion 11a does not necessarily need to be the same as the shape of the sintering material layer 2. The shape of the recessed portion 11a may be any shape corresponding to the curved shape of the sintering material layer 2 such that the sintering material layer 2 contacts the recessed portion 11a when the conductive plate 11 and the semiconductor chip 3 are bonded to each other via the sintering material layer 2.

As a method for forming the recessed portion 11a in the flat conductive plate 11, various methods, such as polishing, laser irradiation, cutting, and etching, can be adopted in addition to the pressurization using the jig 36. Alternatively, it may be acceptable that the flat conductive plate 11 is bonded to the insulating plate 10, the insulating circuit board 1 is produced, and then the recessed portion 11a is formed in the flat conductive plate 11 or it may be acceptable that the recessed portion 11a is formed in the flat conductive plate 11, the conductive plate 11 formed with the recessed portion 11a is bonded to the insulating plate 10, and the insulating circuit board 1 is produced.

Figure 11:
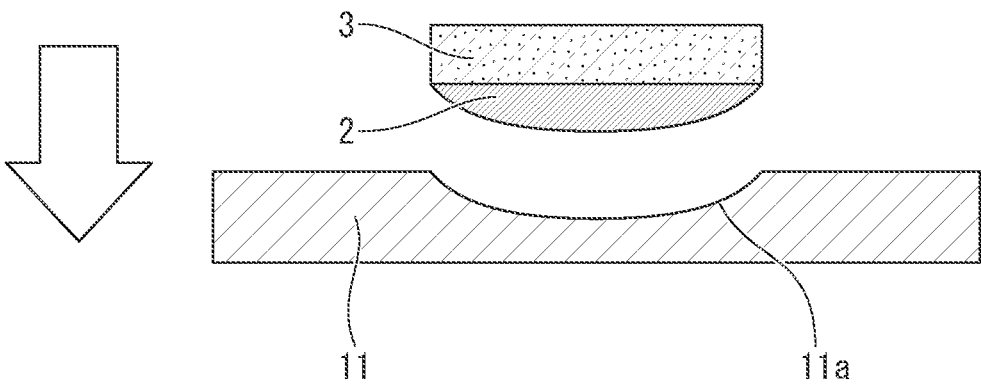
FIG. 11 is a schematic view following FIG. 10 illustrating the method for manufacturing the semiconductor device according to the first embodiment.

Next, the semiconductor chip 3 to which the sintering material layer 2 has been transferred is mounted in the recessed portion 11a of the conductive plate 11 of the insulating circuit board 1 using a carrying machine or the like as illustrated in FIG. 11. Then, pressurization is performed from the upper surface side of the semiconductor chip 3 by a die of a press machine or a pressurizing portion containing a silicon (Si) rubber or the like attached to a die. In a state where the semiconductor chip 3 is pressurized, heating is performed at a temperature equal to or higher than the sintering temperature of the sintering material layer 2, thereby causing a sintering reaction in the sintering material layer 2. For example, the pressurizing force is set to about 1 MPa or more and 60 MPa or less, the heating temperature is set to about 150° C. or more and 350° C. or less, and the heating time is set to about 1 minute or more and 5 minutes or less. As a result, as illustrated in FIG. 2 and FIG. 3, the sintering material layer 2 is bonded to the recessed portion 11a of the conductive plate 11, and the insulating circuit board 1 and the semiconductor chip 3 are bonded to each other via the sintering material layer 2.

Thereafter, a normal process of arranging the case 5 around the insulating circuit board 1 and the semiconductor chip 3, and connecting the insulating circuit board 1, the semiconductor chip 3, and the external terminals 4a, 4b to one another with the bonding wires 6a, 6b, 6c or the like, followed by sealing with a sealing member 7, for example, is performed, completing the semiconductor device according to the first embodiment illustrated in FIG. 1.

According to the method for manufacturing the semiconductor device according to the first embodiment, the recessed portion 11a is formed in advance in the flat conductive plate 11 and the sintering material layer 2 having the curved shape is embedded in the recessed portion 11a, so that the opened shape of the sintering material layer 2 can be reduced in degree or eliminated and non-bonding with the conductive plate 11 in the outer peripheral portion of the sintering material layer 2 can be prevented. This makes it possible to prevent the generation of cracks or the occurrence of peeling in the outer peripheral portion of the sintering material layer 2 and to prevent the lowering of the bonding strength.

Further, due to the contact between the sintering material layer 2 and the recessed portion 11a of the conductive plate 11, the bonded area between the sintering material layer 2 and the conductive plate 11 is larger than that in a case where the sintering material layer 2 contacts the flat conductive plate 11, and therefore heat from the semiconductor chip 3 can be efficiently dissipated via the sintering material layer 2. This makes it possible to realize a semiconductor device with high heat resistance, high heat dissipation, and high reliability.

Second Embodiment

Figure 12:
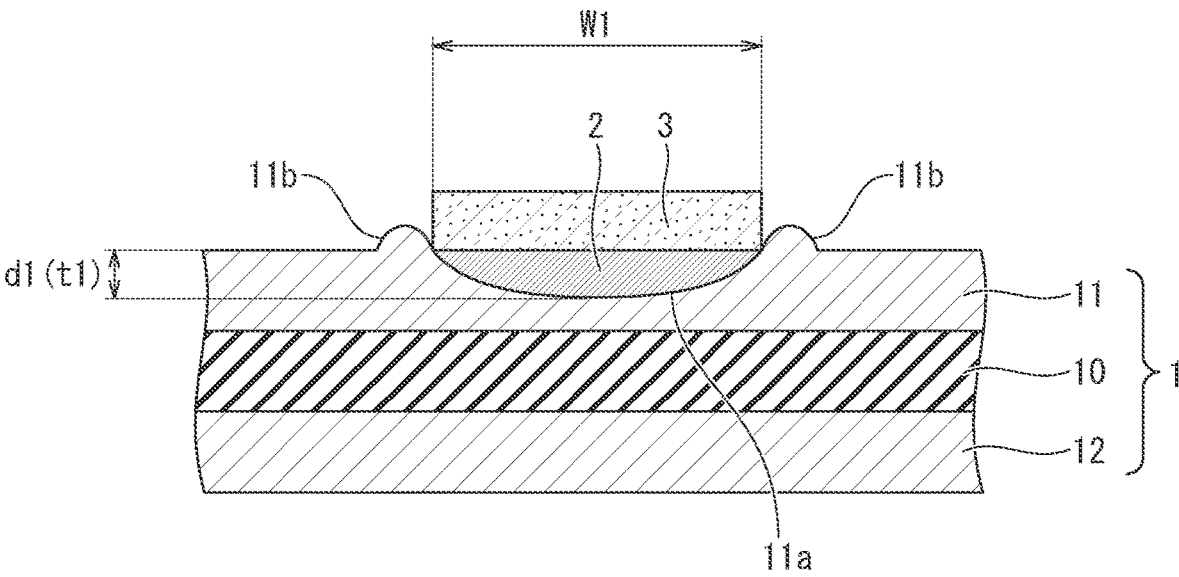
FIG. 12 is a cross-sectional view of a semiconductor device according to a second embodiment.

As illustrated in FIG. 12, a semiconductor device according to a second embodiment is different from the configuration of the semiconductor device according to the first embodiment in that a protrusion portion 11b is provided in the outer periphery of a recessed portion 11a of a conductive plate 11. The protrusion portion 11b can be formed from a residue of the conductive plate 11 during the processing of a recessed portion 11a with a jig or the like. The protrusion portion 11b is provided in a ring shape to surround the outer periphery of the recessed portion 11a, for example.

The other configurations of the semiconductor device according to the second embodiment are the same as the configurations of the semiconductor device according to the first embodiment, and therefore duplicate descriptions are omitted. The semiconductor device according to the second embodiment is realizable by the same procedure as that of the method for manufacturing the semiconductor device according to the first embodiment.

According to the semiconductor device of the second embodiment, a sintering material layer 2 is provided to be embedded in the recessed portion 11a of the conductive plate 11 and contact the recessed portion 11a similarly to the configuration of the semiconductor device according to the first embodiment, and therefore the generation of cracks or the occurrence of peeling in the outer periphery of the sintering material layer 2 can be prevented. Further, the protrusion portion 11b is provided in the outer periphery of the recessed portion 11a of the conductive plate 11, and therefore the misalignment of the semiconductor chip 3 can be prevented.

Third Embodiment

Figure 13:
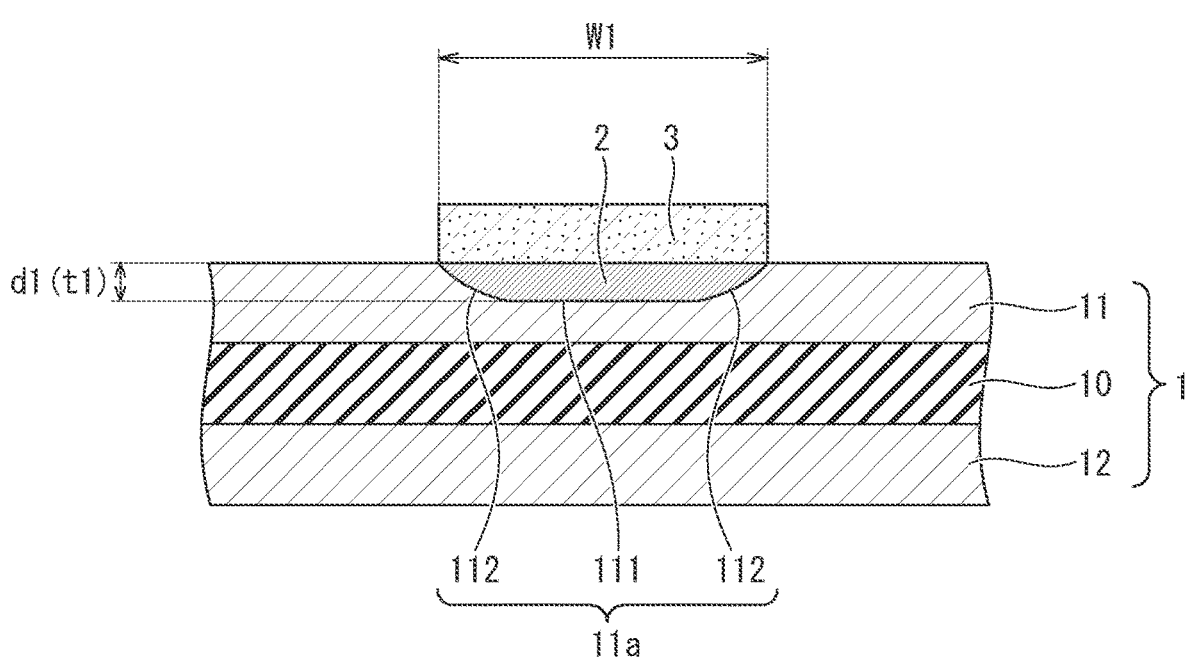
FIG. 13 is a cross-sectional view of a semiconductor device according to a third embodiment.

As illustrated in FIG. 13, a semiconductor device according to a third embodiment is different from the configuration of the semiconductor device according to the first embodiment illustrated in FIG. 3 in that a recessed portion 11a of a conductive plate 11 has a flat bottom surface 111. The recessed portion 11a of the conductive plate 11 has the flat bottom surface 111 positioned on the center side of a semiconductor chip 3 and a side surface 112 which is positioned on the outer peripheral side of the semiconductor chip 3 and a curved surface continuous to the bottom surface 111.

The other configurations of the semiconductor device according to the third embodiment are the same as the configurations of the semiconductor device according to the first embodiment, and therefore duplicate descriptions are omitted. The semiconductor device according to the third embodiment is realizable by the same procedure as that of the method for manufacturing the semiconductor device according to the first embodiment. A sintering material layer 2 having a curved shape is transferred to the semiconductor chip 3, and then the sintering material layer 2 is deformed by pressurization when the semiconductor chip 3 and the conductive plate 11a re bonded to each other via the sintering material layer 2, so that a shape can be formed in which the sintering material layer 2 contacts the recessed portion 11a.

According to the semiconductor device of the third embodiment, even when the recessed portion 11a of the conductive plate 11 has the flat bottom surface 111, the generation of cracks or the occurrence of peeling in the outer periphery of the sintering material layer 2 can be prevented because the sintering material layer 2 is provided to be embedded in the recessed portion 11a of the conductive plate 11 and contact the recessed portion 11a similarly to the configuration of the semiconductor device according to the first embodiment.

Fourth Embodiment

Figure 14:
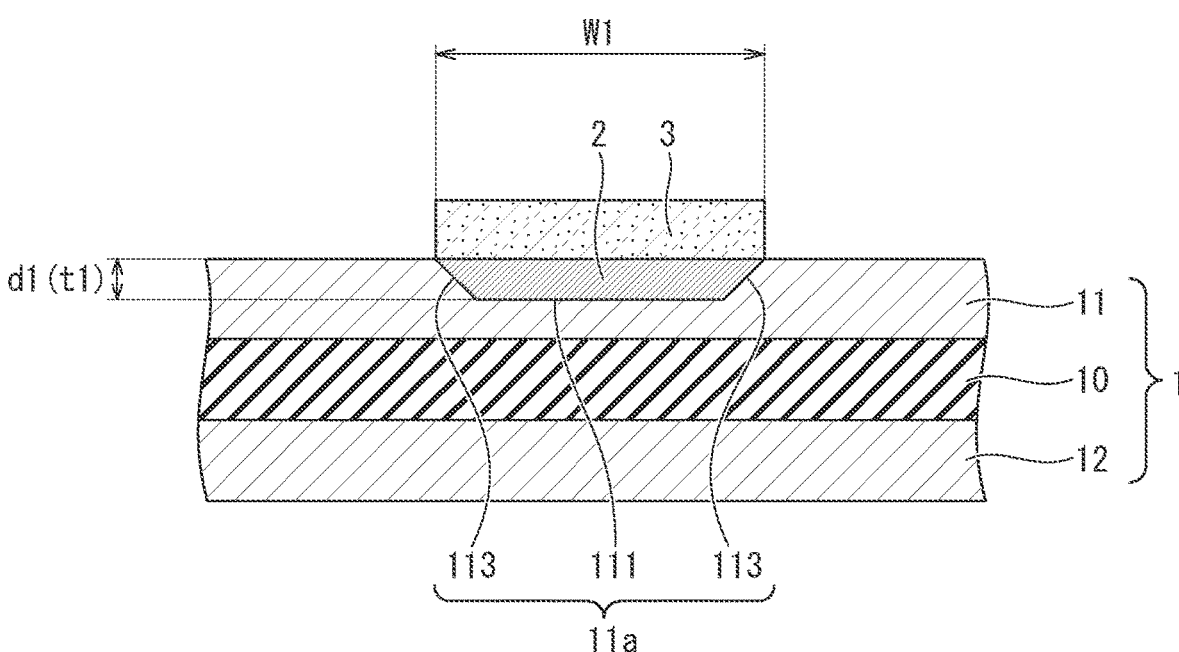
FIG. 14 is a cross-sectional view of a semiconductor device according to a fourth embodiment.

As illustrated in FIG. 14, a semiconductor device according to a fourth embodiment is different from the configuration of the semiconductor device according to the first embodiment illustrated in FIG. 3 in that a recessed portion 11a of a conductive plate 11 has a substantially trapezoidal (tapered) cross-sectional shape in which the upper bottom on the upper surface side (semiconductor chip 3 side) is longer than the lower bottom on the lower surface side (conductive plate 11 side). The recessed portion 11a of the conductive plate 11 has a flat bottom surface 111 positioned on the center side of the semiconductor chip 3 and a side surface 113 which is positioned on the outer peripheral side of the semiconductor chip 3 and a plane (inclined surface) continuous to the bottom surface 111.

The other configurations of the semiconductor device according to the fourth embodiment are the same as the configurations of the semiconductor device according to the first embodiment, and therefore duplicate descriptions are omitted. The semiconductor device according to the fourth embodiment is realizable by the same procedure as that of the method for manufacturing the semiconductor device according to the first embodiment. A sintering material layer 2 having a curved shape is transferred to the semiconductor chip 3, and then the sintering material layer 2 is deformed by pressurization when the semiconductor chip 3 and the conductive plate 11a re bonded to each other via the sintering material layer 2, so that a shape can be formed in which the sintering material layer 2 contacts the recessed portion 11a.

According to the semiconductor device of the fourth embodiment, even when the recessed portion 11a of the conductive plate 11 has the substantially trapezoidal cross-sectional shape, the generation of cracks or the occurrence of peeling in the outer periphery of the sintering material layer 2 can be prevented because the sintering material layer 2 is provided to be embedded in the recessed portion 11a of the conductive plate 11 and contact the recessed portion 11a similarly to the configuration of the semiconductor device according to the first embodiment.

Fifth Embodiment

Figure 15:
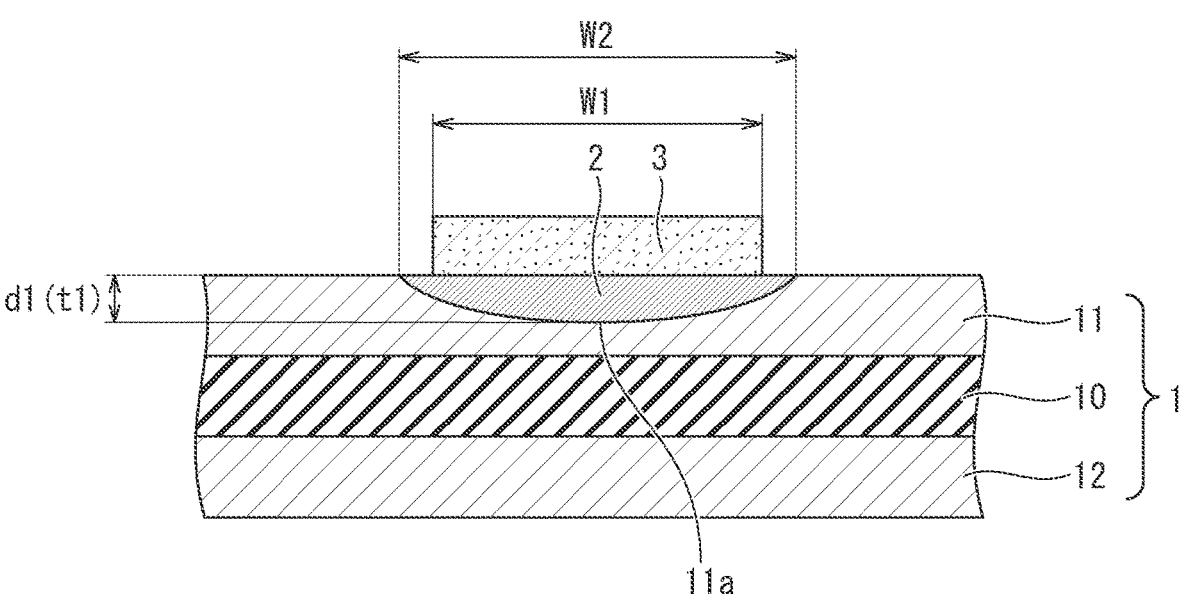
FIG. 15 is a cross-sectional view of a semiconductor device according to a fifth embodiment.

As illustrated in FIG. 15, a semiconductor device according to a fifth embodiment is different from the configuration of the semiconductor device according to the first embodiment illustrated in FIG. 3 in that a width W2 of a recessed portion 11a of a conductive plate 11 and a sintering material layer 2 is larger than a width W1 of a semiconductor chip 3. The outer periphery of the sintering material layer 2 is positioned outside the outer periphery of the semiconductor chip 3.

The other configurations of the semiconductor device according to the fifth embodiment are the same as the configurations of the semiconductor device according to the first embodiment, and therefore duplicate descriptions are omitted. The semiconductor device according to the fifth embodiment is realizable by the same procedure as that of the method for manufacturing the semiconductor device according to the first embodiment. For example, when the sintering material layer 2 is transferred to the semiconductor chip 3, the sintering material layer 2 can be transferred such that the outer periphery of the sintering material layer 2 is positioned outside the outer periphery of the semiconductor chip 3.

The semiconductor device according to the fifth embodiment can prevent the generation of cracks or the occurrence of peeling in the outer periphery of the sintering material layer 2 because the sintering material layer 2 is provided to be embedded in the recessed portion 11a of the conductive plate 11 and contact the recessed portion 11a similarly to the configuration of the semiconductor device according to the first embodiment.

Sixth Embodiment

Figure 16:
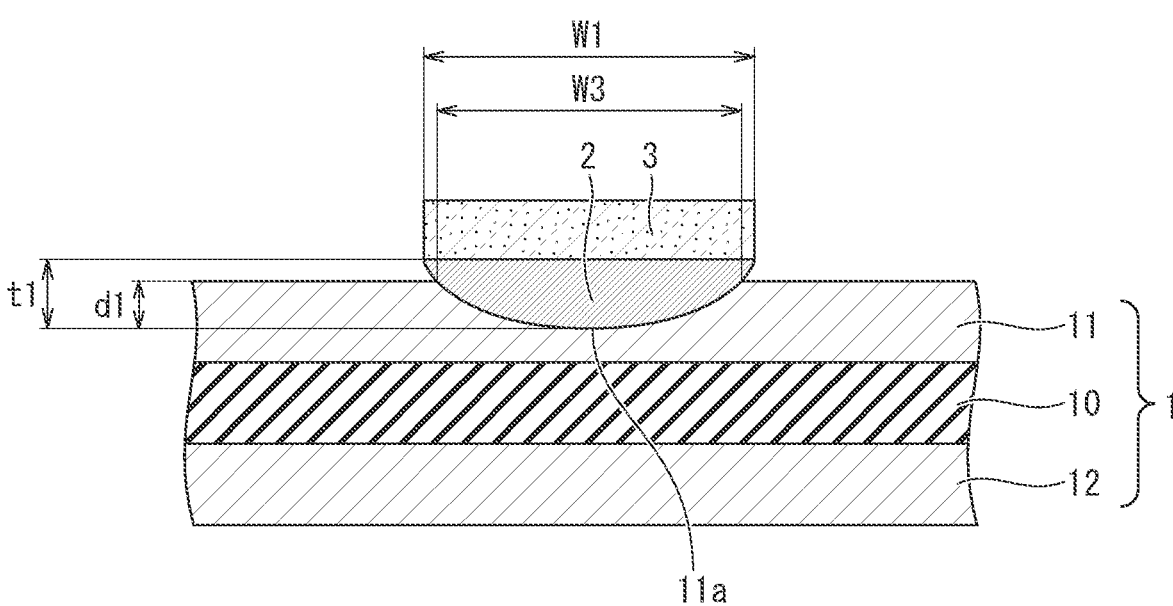
FIG. 16 is a cross-sectional view of a semiconductor device according to a sixth embodiment.

As illustrated in FIG. 16, a semiconductor device according to a sixth embodiment is different from the configuration of the semiconductor device according to the first embodiment in that a depth d1 of a recessed portion 11a of a conductive plate 11 is smaller than a thickness t1 of a sintering material layer 2 and a width W3 of the recessed portion 11a of the conductive plate 11 is smaller than a width W1 of a semiconductor chip 3. The sintering material layer 2 projects upward from the main surface of the conductive plate 11 corresponding to a thickness (t1-d1), and the sintering material layer 2 is partially provided on the main surface of the conductive plate 11.

The other configurations of the semiconductor device according to the sixth embodiment are the same as the configurations of the semiconductor device according to the first embodiment, and therefore duplicate descriptions are omitted. The semiconductor device according to the sixth embodiment is realizable by the same procedure as that of the method for manufacturing the semiconductor device according to the first embodiment.

The semiconductor device according to the sixth embodiment can prevent the generation of cracks or the occurrence of peeling in the outer periphery of the sintering material layer 2 because the sintering material layer 2 is provided to be partially embedded in the recessed portion 11a of the conductive plate 11 and contact the recessed portion 11a similarly to the configuration of the semiconductor device according to the first embodiment. Further, the lower surface of the semiconductor chip 3 is separated from the main surface of the conductive plate 11, and therefore damage due to the contact of the semiconductor chip 3 with the main surface of the conductive plate 11 can be prevented.

Seventh Embodiment

Figure 17:
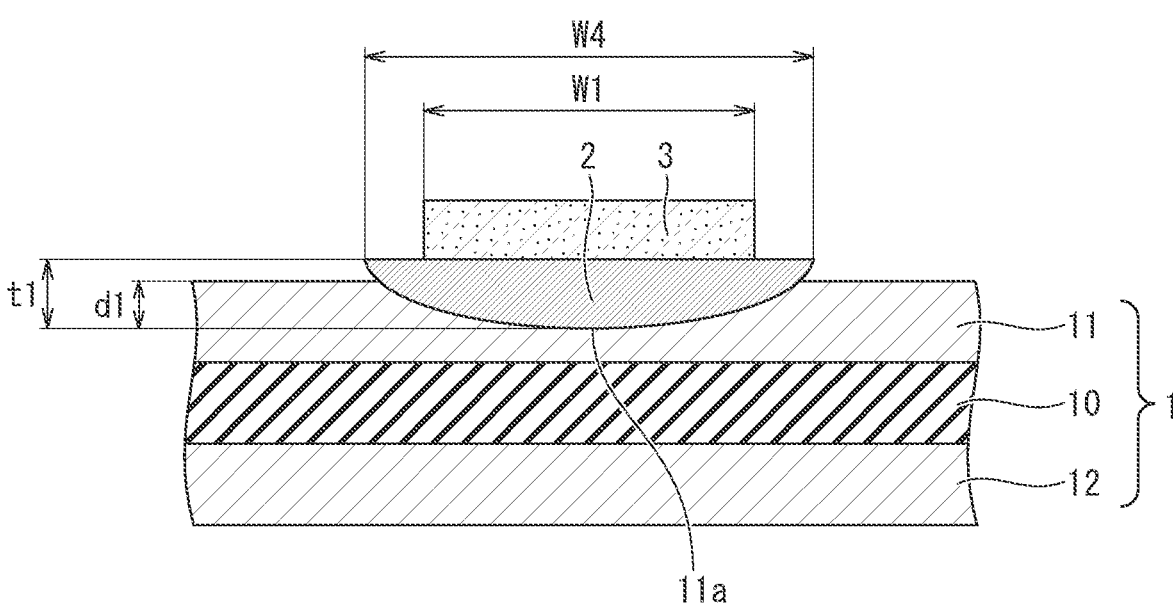
FIG. 17 is a cross-sectional view of a semiconductor device according to a seventh embodiment.

As illustrated in FIG. 17, a semiconductor device according to a seventh embodiment is different from the configuration of the semiconductor device according to the first embodiment illustrated in FIG. 3 in that a depth d1 of a recessed portion 11a of a conductive plate 11 is smaller than a thickness t1 of a sintering material layer 2 and a width W4 of the recessed portion 11a of the conductive plate 11 is larger than a width W1 of a semiconductor chip 3. The sintering material layer 2 projects upward from the main surface of the conductive plate 11 corresponding to a thickness (t1-d1), and the sintering material layer 2 is partially provided on the main surface of the conductive plate 11.

The other configurations of the semiconductor device according to the seventh embodiment are the same as the configurations of the semiconductor device according to the first embodiment, and therefore duplicate descriptions are omitted. The semiconductor device according to the seventh embodiment is realizable by the same procedure as that of the method for manufacturing the semiconductor device according to the first embodiment. For example, when the sintering material layer 2 is transferred to the semiconductor chip 3, the sintering material layer 2 can be transferred such that the outer periphery of the sintering material layer 2 is positioned outside the outer periphery of the semiconductor chip 3.

The semiconductor device according to the seventh embodiment can prevent the generation of cracks or the occurrence of peeling in the outer periphery of the sintering material layer 2 because the sintering material layer 2 is provided to be partially embedded in the recessed portion 11a of the conductive plate 11 and contact the recessed portion 11a similarly to the configuration of the semiconductor device according to the first embodiment. Further, the lower surface of the semiconductor chip 3 is separated from the main surface of the conductive plate 11, and therefore damage due to the contact of the semiconductor chip 3 with the main surface of the conductive plate 11 can be prevented.

Eighth Embodiment

Figure 18:
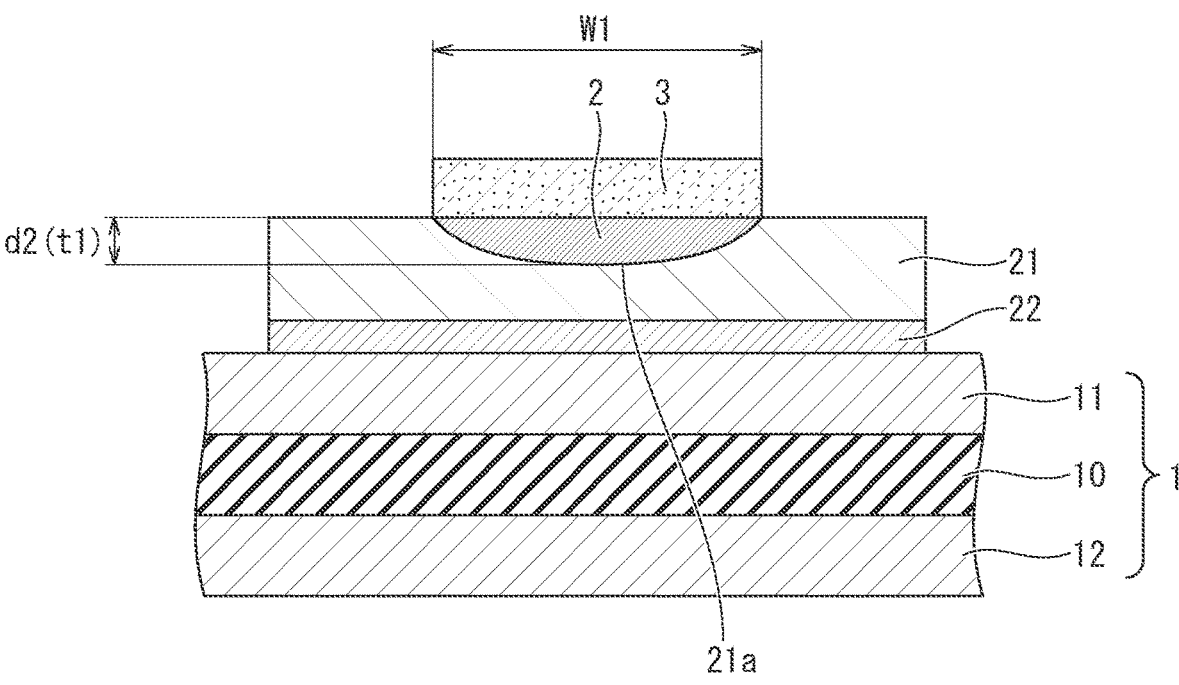
FIG. 18 is a cross-sectional view of a semiconductor device according to an eighth embodiment.

As illustrated in FIG. 18, a semiconductor device according to an eighth embodiment is different from the configuration of the semiconductor device according to the first embodiment illustrated in FIG. 3 in that a conductive plate 21 different from a conductive plate 11 of an insulating circuit board 1 is bonded to a sintering material layer 2. The conductive plate 21 is a conductive block (heat spreader) for heat dissipation containing conductive materials, such as copper (Cu), for example. The lower surface of the conductive plate 21 is bonded to the conductive plate 11 of the insulating circuit board 1 via a bonding layer 22, such as solder. The conductive plate 21 is provided with a recessed portion 21a in the main surface (upper surface). The shape of the recessed portion 21a is the same as that of the recessed portion 11a of the conductive plate 11 of the insulating circuit board 1 illustrated in FIG. 3.

The other configurations of the semiconductor device according to the eighth embodiment are the same as the configurations of the semiconductor device according to the first embodiment, and therefore duplicate descriptions are omitted. The semiconductor device according to the eighth embodiment is realizable by the same procedure as that of the method for manufacturing the semiconductor device according to the first embodiment.

According to the semiconductor device of the eighth embodiment, even when the recessed portion 21a is provided in the conductive plate 21 different from the conductive plate 11 of the insulating circuit board 1, the generation of cracks or the occurrence of peeling in the outer periphery of the sintering material layer 2 can be prevented because the sintering material layer 2 is provided to be embedded in the recessed portion 21a of the conductive plate 21 and contact the recessed portion 21a.

Other Embodiments

As described above, the invention has been described according to the first to eighth embodiments, but it should not be understood that the description and drawings implementing a portion of this disclosure limit the invention. Various alternative embodiments of the present invention, examples, and operational techniques will be apparent to those skilled in the art from this disclosure.

For example, as the semiconductor devices according to the first to eighth embodiments, the configuration in which the semiconductor chip 3 is connected via the bonding wires 6a, 6b, 6c is described as an example, but the present invention is not limited thereto. For example, the present invention is also applicable to a semiconductor device configured such that an implant substrate in which a pin-like post electrode is inserted into a printed circuit board is provided above the semiconductor chip 3 and the semiconductor chip 3 and the post electrode are connected to each other.

The respective configurations disclosed in the first to eighth embodiments of the present invention and the respective modified examples can be combined together as necessary within a range without contradicting each other. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
a semiconductor chip;
a sintering material layer bonded to a lower surface of the semiconductor chip and having a thickness decreasing from a center side of the semiconductor chip toward an outer periphery of the semiconductor chip; and
a conductive plate having a main surface facing the lower surface of the semiconductor chip and a recessed portion in the main surface such that the sintering material layer contacts the recessed portion, the recessed portion having a depth decreasing from the center side of the semiconductor chip toward the outer periphery of the semiconductor chip.

2. The semiconductor device of claim 1, wherein at least an end of the recessed portion is a curved surface.

3. The semiconductor device of claim 1, wherein the recessed portion has a flat bottom surface.

4. The semiconductor device of claim 1, wherein the recessed portion has a tapered cross-sectional shape.

5. The semiconductor device of claim 1, wherein an outer periphery of the sintering material layer is in alignment with the outer periphery of the semiconductor chip.

6. The semiconductor device of claim 1, wherein an outer periphery of the sintering material layer is provided outside the outer periphery of the semiconductor chip.

7. The semiconductor device of claim 1, wherein an outer periphery of the recessed portion is in alignment with the outer periphery of the semiconductor chip.

8. The semiconductor device of claim 1, wherein an outer periphery of the recessed portion is provided outside the outer periphery of the semiconductor chip.

9. The semiconductor device of claim 1, wherein an outer periphery of the recessed portion is provided inside the outer periphery of the semiconductor chip.

10. The semiconductor device of claim 1, wherein a thickness of the sintering material layer matches a depth of the recessed portion.

11. The semiconductor device of claim 1, wherein a thickness of the sintering material layer is larger than a depth of the recessed portion, and the sintering material layer is partially provided on the main surface.

12. The semiconductor device of claim 1, wherein a protrusion portion is provided in the outer periphery of the recessed portion of the conductive plate.

13. The semiconductor device of claim 1, wherein the conductive plate is a part of an insulating circuit board.

14. The semiconductor device of claim 1, wherein the conductive plate is a conductive block, and the conductive block is arranged on an insulating circuit board.

15. The semiconductor device of claim 1, wherein the conductive plate contains a material containing copper as a main component.

16. A method for manufacturing a semiconductor device comprising:

forming a recessed portion in a main surface of a conductive plate;

transferring a sintering material layer having a curved shape to a lower surface of a semiconductor chip; and causing the sintering material layer transferred to the semiconductor chip to face the recessed portion of the conductive plate, sintering the sintering material layer by performing pressurization and heating from an upper surface side of the semiconductor chip, and bonding the conductive plate and the semiconductor chip to each other, such that the sintering material layer bonded to the lower surface of the semiconductor chip has a thickness decreasing from a center side of the semiconductor chip toward an outer periphery of the semiconductor chip, resulting in the recessed portion having a depth decreasing from the center side of the semiconductor chip toward the outer periphery of the semiconductor chip.

17. The semiconductor device of claim 1, wherein a depth of the recessed portion is largest in a center portion of the recessed portion.

18. The semiconductor device of claim 1, wherein a thickness of the sintering material layer is largest in a center portion of the semiconductor chip.

\* \* \* \* \*